United States Patent [19]
Brown et al.

[11] Patent Number: 5,749,088
[45] Date of Patent: May 5, 1998

[54] MEMORY CARD WITH ERASURE BLOCKS AND CIRCUITRY FOR SELECTIVELY PROTECTING THE BLOCKS FROM MEMORY OPERATIONS

[75] Inventors: David M. Brown, Fair Oaks; Russell D. Eslick, Placerville; Kurt B. Robinson, Newcastle, all of Calif.

[73] Assignee: Intel Corporation, Santa Clara, Calif.

[21] Appl. No.: 844,851

[22] Filed: Apr. 22, 1997

Related U.S. Application Data

[63] Continuation of Ser. No. 587,337, Jan. 16, 1996, abandoned, which is a continuation of Ser. No. 307,317, Sep. 15, 1994, abandoned.

[51] Int. Cl.$^6$ .................. G06F 12/00; G11C 7/00; G11C 11/34
[52] U.S. Cl. .............. 711/115; 364/DIG. 1; 364/DIG. 2; 365/52; 365/189.01; 365/189.03; 365/195; 711/5; 711/100
[58] Field of Search ................ 364/DIG. 1, DIG. 2; 365/52, 189.01, 189.03, 230.01; 711/5, 115, 152, 163, 100

[56] References Cited

U.S. PATENT DOCUMENTS

| | | | |
|---|---|---|---|
| 4,451,903 | 5/1984 | Jordan . | |
| 4,665,506 | 5/1987 | Cline et al. | 365/189 |
| 4,811,293 | 3/1989 | Knothe et al. | 365/189 |
| 4,961,172 | 10/1990 | Shubat et al. | 365/230.06 |
| 5,065,364 | 11/1991 | Atwood et al. | 365/185 |
| 5,197,034 | 3/1993 | Fandrich et al. | 365/227 |
| 5,224,070 | 6/1993 | Fandrich et al. | 365/185 |
| 5,226,006 | 7/1993 | Wang et al. | 365/189.01 |
| 5,245,572 | 9/1993 | Kosonocky et al. | 365/185 |
| 5,249,158 | 9/1993 | Kynett et al. | 365/185 |
| 5,267,218 | 11/1993 | Elbert | 365/226 |
| 5,278,786 | 1/1994 | Kawauchi et al. | 365/185 |
| 5,280,449 | 1/1994 | Oldham | 365/189.02 |
| 5,287,310 | 2/1994 | Schreck et al. | 365/189.05 |
| 5,293,344 | 3/1994 | Akaogi | 365/210 |
| 5,297,103 | 3/1994 | Higuchi | 365/230.03 |
| 5,303,198 | 4/1994 | Adachi et al. | 365/218 |
| 5,329,491 | 7/1994 | Brown et al. | 365/226 |
| 5,353,256 | 10/1994 | Fandrich et al. | 365/230.03 |
| 5,357,573 | 10/1994 | Walters | 380/25 |
| 5,361,228 | 11/1994 | Adachi et al. | 365/189.03 |
| 5,361,343 | 11/1994 | Kosonocky et al. | 365/185.11 |
| 5,363,334 | 11/1994 | Alexander et al. | 365/218 |
| 5,369,754 | 11/1994 | Fandrich et al. | 395/430 |
| 5,386,539 | 1/1995 | Nishi | 395/425 |
| 5,388,248 | 2/1995 | Robinson et al. | 395/425 |
| 5,422,855 | 6/1995 | Estick et al. | 365/226 |
| 5,448,712 | 9/1995 | Kynett et al. | 395/430 |

*Primary Examiner*—Tod R. Swann
*Assistant Examiner*—Tuan V. Thai
*Attorney, Agent, or Firm*—Blakely, Sokoloff, Taylor & Zafman

[57] ABSTRACT

A memory card includes a plurality of memories, each having an array that includes a first block and a second block. Control circuitry is coupled to the array for controlling memory operations of the array. A block write protect circuit is provided for storing block lock data to selectively lock control circuitry from accessing the array for the memory operations. The block write protect circuit locks the control circuit from accessing (1) the first block when the block write protect circuit stores a first datum of the data and (2) the second block when the block write protect circuit stores a second datum of the data. A control input is coupled to the block write protect circuit for applying a control signal to enable the block write protect circuit to lock the control circuitry in accordance with the data. The memory card further includes a register circuit coupled to the control input of each of the plurality of memories for storing a control datum to generate the control signal. When the register circuit stores the control datum to generate the control signal, the block write protect circuit of each of the plurality of memories is enabled to lock the respective control circuitry from selectively accessing the respective first and second blocks in accordance with the respective block lock data.

7 Claims, 5 Drawing Sheets

| $\overline{WP}$ | $\overline{BS1}$ | BL | REMARKS |
|---|---|---|---|
| 0 | 0 | 1 | BLOCK WRITE PROTECT ENABLED AND BLOCK1 IS LOCKED |
| 0 | 1 | 0 | BLOCK WRITE PROTECT ENABLED AND BLOCK1 IS NOT LOCKED |
| 1 | X | 0 | BLOCK WRITE PROTECT ENABLED |

X = DO NOT CARE

*Figure 5*

MEMORY CARD WITH ERASURE BLOCKS AND CIRCUITRY FOR SELECTIVELY PROTECTING THE BLOCKS FROM MEMORY OPERATIONS

This is a continuation of application Ser. No. 08/587,337, filed Jan. 16, 1996, now abandoned, which is a continuation of application Ser. No. 08/307,317, filed Sep. 15, 1994, abandoned.

FIELD OF THE INVENTION

The present invention pertains to the field of computer memories. More particularly, this invention relates to an electrically erasable and programmable memory card with erasure blocks and circuitry for selectively protecting the blocks from reprogramming memory operations.

BACKGROUND OF THE INVENTION

One type of prior art nonvolatile memory is the flash erasable and electrically programmable read-only memory ("flash EPROM"). The flash EPROM can be programmed by a user. Once programmed, the entire contents of the flash EPROM can be erased by electrical erasure. The flash EPROM may then be reprogrammed with new data.

Prior art flash EPROMs are nonvolatile and reprogrammable, and this has permitted the flash EPROM technology to be used for removable data storage. One such prior art application is the flash EPROM memory card ("flash memory card"). The flash memory card typically includes a number of flash EPROMs. The flash memory card can be erased and programmed electrically. The memory array of each of the flash EPROMs in the card is typically organized into blocks such that each block can be individually erased.

One disadvantage associated with this memory configuration of the flash memory card is that data stored in one block may be inadvertently erased during a programming or erasure operation of another memory block. The inadvertent programming or erasure in that memory block may occur when an error in an address for a different memory block directs the operation to the above-mentioned memory block. The inadvertent programming or erasure in that memory block causes damage to the data integrity of that memory block. Typically, some of the memory blocks in the flash memory card store data that require less amount of data update than data stored in other memory blocks of the flash memory card. Therefore, a mechanism is required to lock individual memory blocks within each flash EPROM of the flash memory card temporarily from being programmed or erased.

SUMMARY AND OBJECTS OF THE INVENTION

One of the objects of the present invention is to provide a reprogrammable nonvolatile memory card that allows memory blocks within each of a plurality of flash EPROMs of the card to be individually protected from being programmed and erased.

Another object of the present invention is to provide a reprogrammable nonvolatile memory card with a block write protect circuit for selectively protecting individual blocks in each of the flash EPROMs of the flash memory card from being programmed and erased and a circuit for enabling the block write protect circuit in each of the flash EPROMs of the card.

A further object of the present invention is to provide a reprogrammable nonvolatile memory card that allows individual blocks in each of the flash EPROMs of the flash memory card to be selectively write protected.

A nonvolatile memory card includes a plurality of memories, each having an array that includes a first block and a second block. Control circuitry is coupled to the array for controlling memory operations of the array. A block write protect circuit is provided for storing block lock data to selectively lock control circuitry from accessing the array for the memory operations. The block write protect circuit locks the control circuitry from accessing (1) the first block when the block write protect circuit stores a first datum of the data and (2) the second block when the block write protect circuit stores a second datum of the data. A control input is coupled to the block write protect circuit for applying a control signal to enable the block write protect circuit to lock the control circuitry in accordance with the data. The memory card further includes a register circuit coupled to the control input of each of the plurality of memories for storing a control datum to generate the control signal. When the register circuit stores the control datum to generate the control signal, the block write protect circuit of each of the plurality of memories is enabled to lock the respective control circuitry from selectively accessing the respective first and second blocks in accordance with the respective block lock data. When the register circuit does not generate the control signal by not storing the control datum, the block write protect circuit of each of the plurality of memories is disabled from locking the respective control circuitry from accessing the respective array regardless of the respective block lock data stored in the respective block write protect circuit and the respective block lock data can be changed.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 5 is a logic table showing the relationship of $\overline{WP}$, $\overline{BS1}$, and BL signals of FIGS. 2–4.

DETAILED DESCRIPTION

Figure 1:
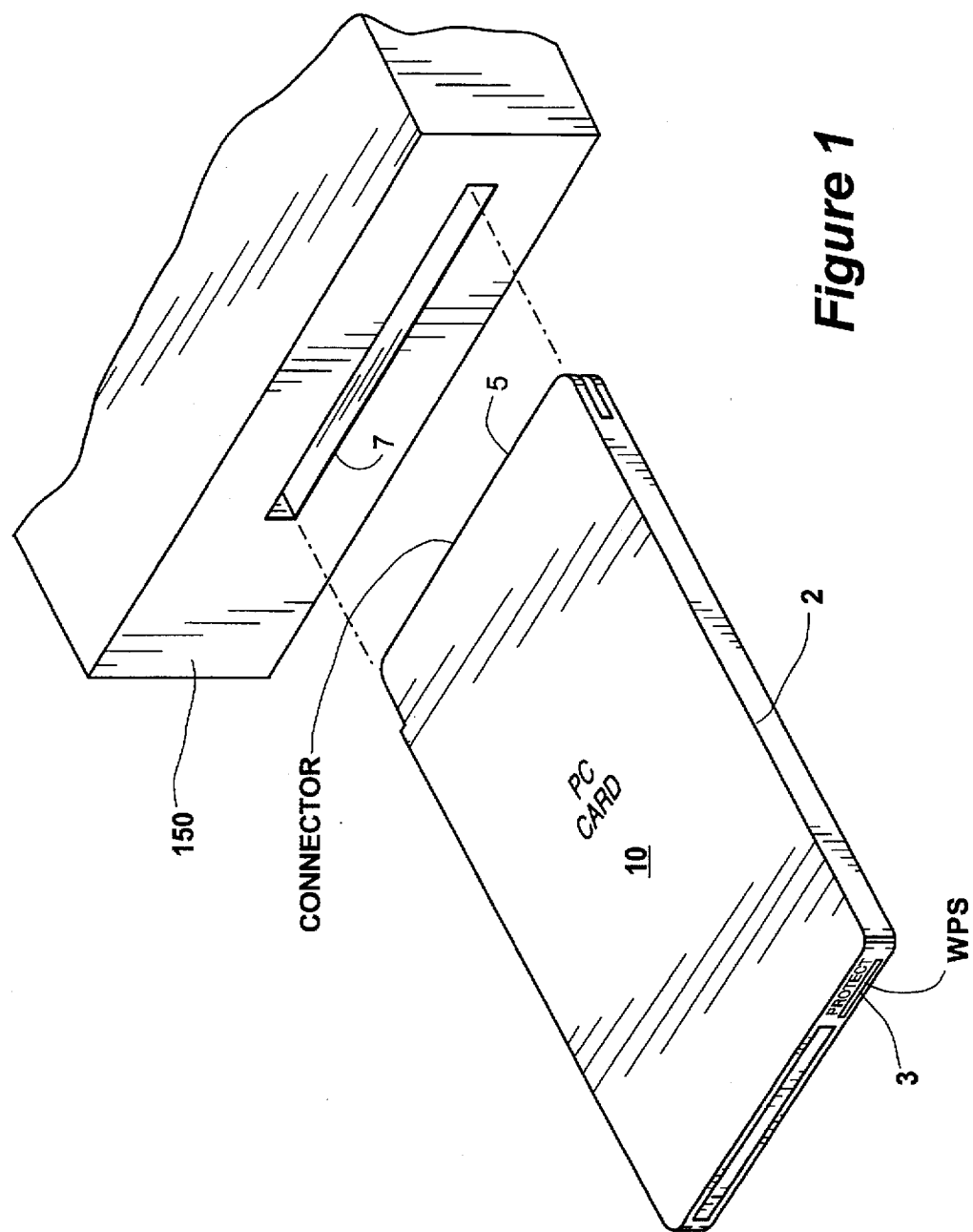
FIG. 1 is a perspective view of a flash memory card to be inserted into a computer system.

FIG. 1 is a perspective view of a flash memory card 10. Flash memory card 10 is inserted into a slot 7 of a computer 150 for a memory read or write operation. Card 10 includes connector 5 located on one side of card 10 to connect to computer 150 when connector 5 is inserted into slot 7.

Computer 150 can be a portable computer, a laptop computer, a desk-top computer, a workstation, a mini computer, a mainframe, or any other type of computer.

Figure 2:
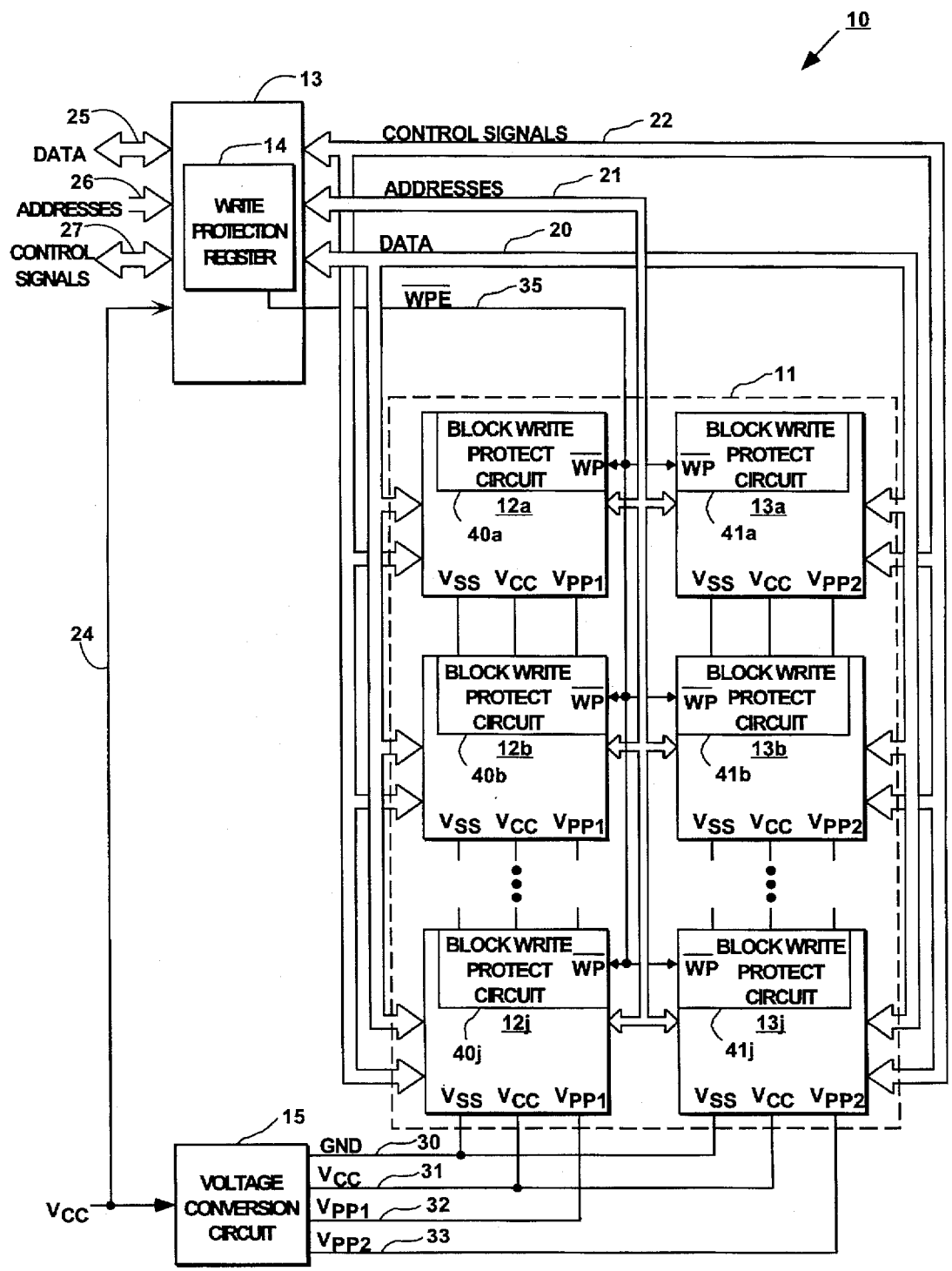
FIG. 2 is a block diagram of the flash memory card, which includes a plurality of flash EPROMs, each having a write protect $\overline{WP}$ input pin for enabling a block write protection scheme in each of the flash EPROMs, wherein the flash memory card also includes a write protection register for generating a $\overline{WPE}$ signal to enable the block write protection scheme of each of the flash EPROMs.

FIG. 2 is a block diagram of flash memory card 10 which implements an embodiment of the present invention. Flash memory card 10 includes a memory array 11 that includes a plurality of flash EPROMs 12a through 12j and 13a through 13j.

Each of flash EPROMs 12a–12j and 13a–13j includes address pins, data pins, and control pins (all are not shown). Addresses are applied to the address pins of each of flash EPROMs 12a–12j and 13a–13j via address bus 21. Data are applied to and from the data pins of each of flash EPROMs 12a–12j and 13a–13j via data bus 20. In addition, commands are also applied to the data pins of each of flash EPROMs 12a–12j and 13a–13j via data bus 20. Control signals are applied to the control pins of each of flash EPROMs 12a–12j and 13a–13j via control signal bus 22.

Figure 3:
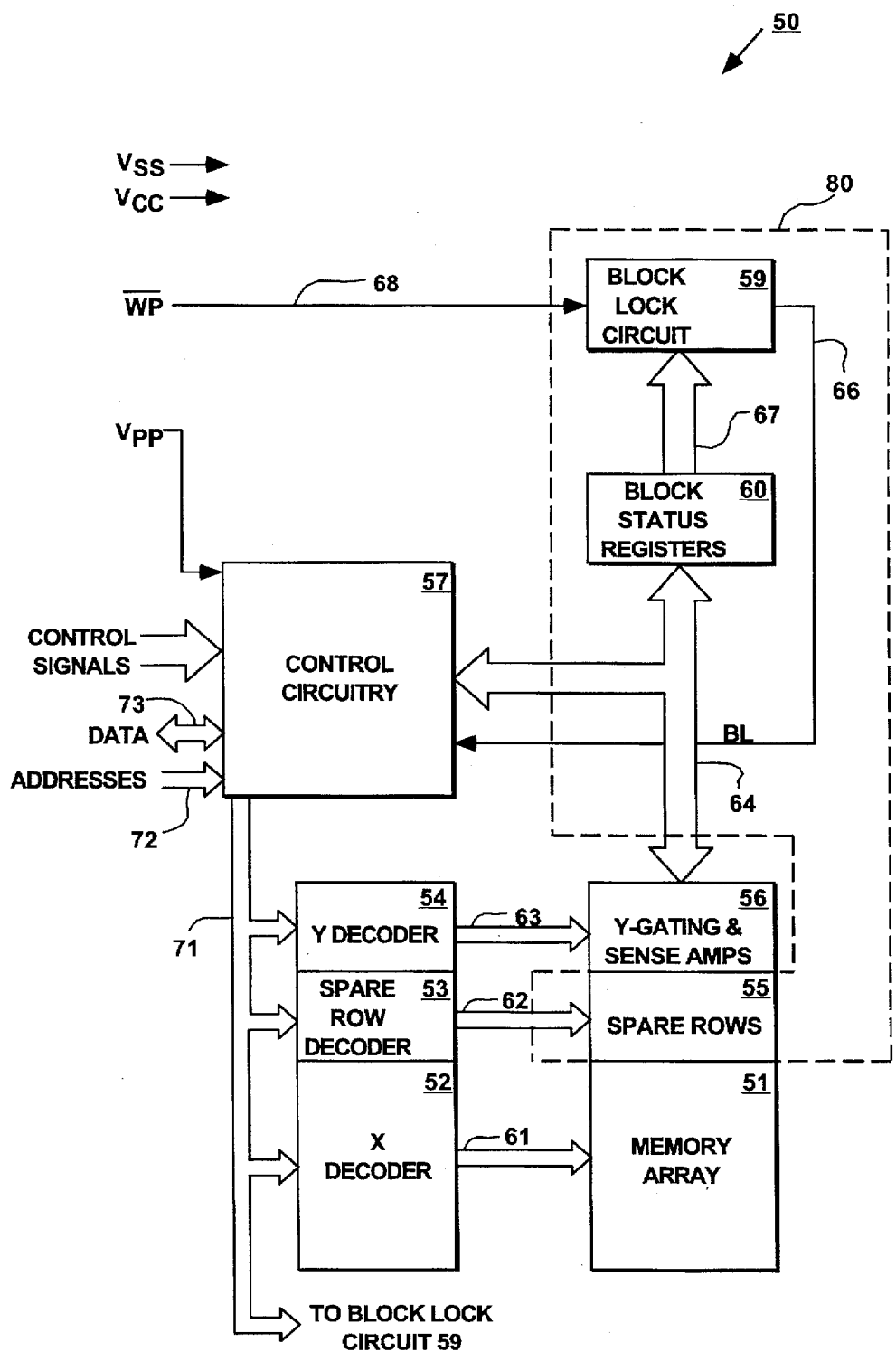
FIG. 3 is a block diagram of one of the flash EPROMs of FIG. 2, wherein the flash EPROM includes spare rows of memory cells, a block status register, a block lock circuit, and the write protect input pin $\overline{WP}$.
Figure 4:
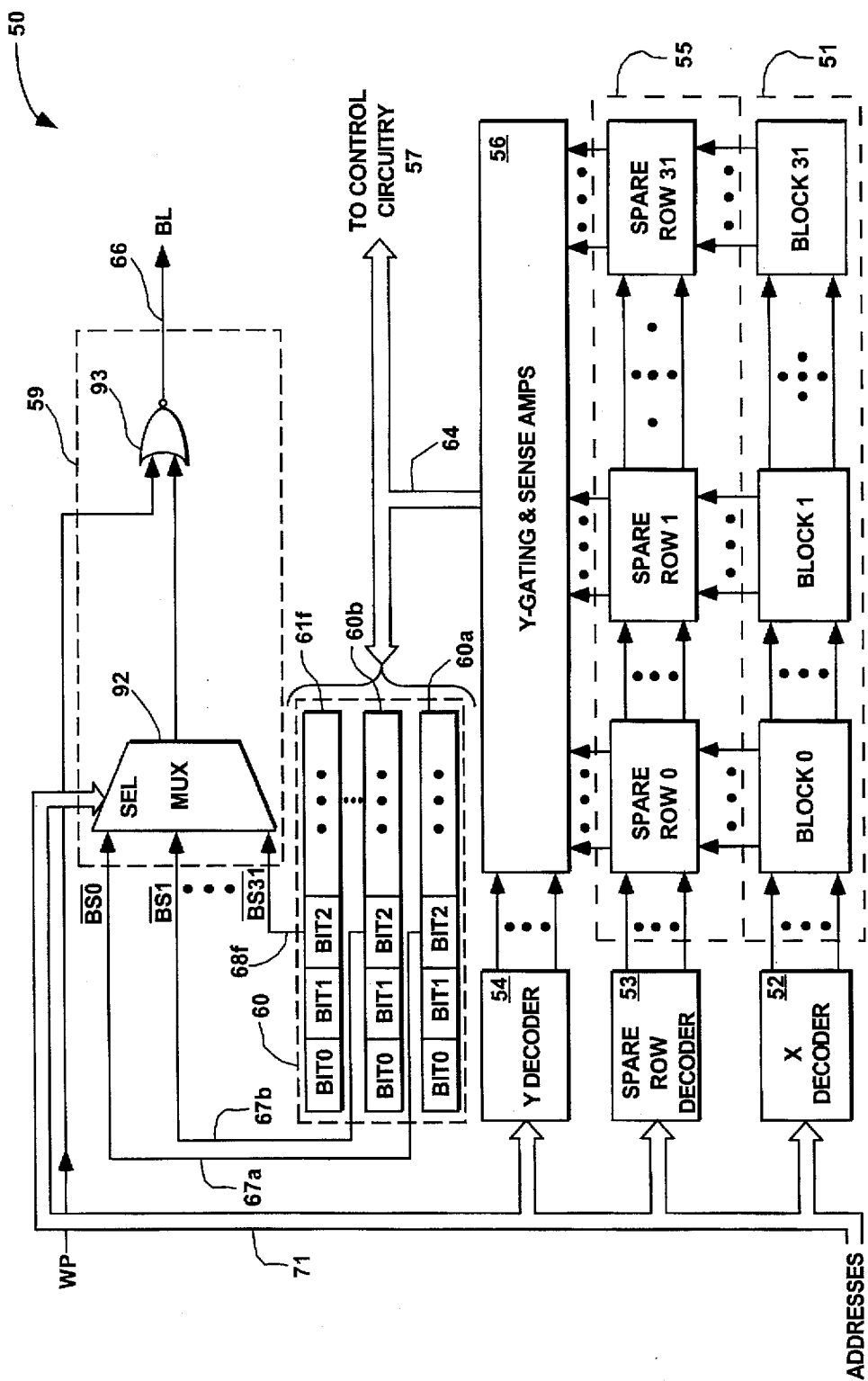
FIG. 4 is another block diagram of the flash EPROM of FIG. 3 that illustrates the circuitry of the block status register and the block lock circuit.

Each of flash EPROMs 12a–12j and 13a–13j also includes a write protect enable input pin $\overline{WP}$. The $\overline{WP}$ pin receives a write protect enable signal $\overline{WPE}$ from a line 35. As can be seen from FIG. 2, line 35 supplies the write protect enable $\overline{WPE}$ signal to the $\overline{WP}$ pin of each of the flash EPROMs 12a–12j and 13a–13j. As will be described in more detail below in conjunction with FIGS. 3–5, each of flash EPROMs 12a–12j and 13a–13j includes a block write protect circuit (e.g., circuit 40a) that, when enabled, can selectively protect individual blocks within that flash EPROM from being programmed or erased. The block write protect circuit stores block lock information as to which blocks are to be protected from being programmed and erased and which blocks should not. When the $\overline{WPE}$ signal applied to the $\overline{WP}$ pin of each of flash EPROMs 12a–12j and 13a–13j is asserted, the block write protect circuit in each of flash EPROMs 12a–12j and 13a–13j is enabled to selectively protect the individual blocks within the respective flash EPROM from being programmed or erased in accordance with the block lock information of that flash EPROM. Meanwhile, those unlocked blocks in each of flash EPROMs 12a–12j and 13a–13j, however, can still be accessed for the programming and erasure operations. When the $\overline{WPE}$ signal applied at the $\overline{WP}$ pin of each of flash EPROMs 12a–12j and 13a–13j is deasserted, the block write protect circuit in each of flash EPROMs 12a–12j and 13a–13j is disabled from selectively protecting the individual blocks from being programmed or erased regardless of the block lock information stored and the block lock information can be updated. FIGS. 3 and 4 show the structure of a flash EPROM 50 that can be any one of flash EPROMs 12a–12j and 13a–13j. Flash EPROM 50 employs a block write protect circuit 80, which can be anyone of block write protect circuits 40a–40j and 41a–41j of flash EPROMs 12a–12j and 13a–13j. Flash EPROM 50 will be described in more detail below, in conjunction with FIGS. 3–5.

Referring to FIGS. 3 and 4, the $\overline{WP}$ pin of flash EPROM 50 is coupled to a block lock circuit 59. Block lock circuit 59 is connected to control circuitry 57 via a line 66. As described above, the $\overline{WP}$ pin of flash EPROM 50 receives the $\overline{WPE}$ signal. The $\overline{WP}$ pin then supplies a $\overline{WP}$ signal to block lock circuit 59. The $\overline{WP}$ signal assumes the same logical value as the $\overline{WPE}$ signal. The $\overline{WP}$ control signal, when asserted, enables block lock circuit 59 to lock control circuitry 57 from accessing individual blocks of memory array 51 in accordance with block lock information from block status registers 60. When the $\overline{WP}$ control signal is deasserted, block lock circuit 59 is disabled from locking control circuitry 57. This will be described in more detail below. Block lock circuit 59 generates a block lock BL signal to control circuitry 57 via line 66.

Block status registers 60 are connected to block lock circuit 59. Moreover, flash EPROM 50 includes spare rows 55 connected to block status registers 60 via Y-gating and sense amplifiers 56. Spare rows 55 and block status registers 60 store the block lock information which is then applied to block lock circuit 59 for locking control circuitry 57 from accessing the respective blocks of memory array 51 for the programming and erasure operations. Spare rows 55, block status registers 60, and block lock circuit 59 together form block write protect circuit 80 of flash EPROM 50.

As can be seen from FIG. 4, memory array 51 of flash EPROM 50 includes a plurality of blocks BLOCK 0 through BLOCK 31. Spare rows 55 are located peripheral to memory array 51. Spare rows 55 include a number of memory rows SPARE ROW 0 through SPARE ROW 31, each corresponding to one of the memory blocks of memory array 51. Each of spare rows 55 includes flash EPROM cells to store the block lock information of its respective block of memory array 51. Alternatively, each block of memory array 51 may correspond to two spare rows of spare rows 55.

Referring again to FIGS. 3 and 4, control circuitry 57 of flash EPROM 50 controls the memory operations with respect to memory array 51 and spare rows 55. The memory operations include read, programming, and erasure operations. For one embodiment, control circuitry 57 is a microcontroller. Control circuitry 57 regulates the memory operations of flash EPROM 50 after receiving an initiating command from external circuitry via data bus 73.

Spare rows 55 and block status registers 60 are accessible by control circuitry 57 via special commands. The special commands include a spare row write command, a spare row read command, a block status register write command, and a block status register read command.

When the block lock information of a particular block is stored in the corresponding row of spare rows 55, this block lock information can be read out to the corresponding one of block status registers 60. When stored in the corresponding one of block status registers 60, the block lock information is used to lock the associative memory block from being accessed for the programming and erasure operations. When a memory block of memory array 51 is locked from being accessed for the programming and erasure operations, its corresponding row or rows of spare rows 55 are also locked from being accessed from the programming and erasure operations. The locked memory block and its associative spare row, however, can be accessed for a read operation.

Spare rows 55 also store a spare row data valid flag for each of the memory blocks of memory array 51. The spare row data valid flag is used to indicate if the block lock information for that particular memory block stored in the corresponding row of spare rows 55 is valid or not.

Block status registers 60 include a number of registers 60a through 61f, each being associated with one of spare rows 55 for storing the block lock information for the respective memory block of memory array 51. For one embodiment, BIT2 of each of registers 60a–61f stores the block lock information received from its corresponding one of spare rows 55. When the block lock information for a particular block stored in one of spare rows 55 is required to be supplied to the respective one of registers 60a–61f, the data comprising the block lock information are read to the respective register from the respective one of spare rows 55. The block lock information in that data is stored in BIT2 of that register.

BIT2 of each of registers 60a–61f generates one of block lock signals $\overline{BS0}$ through $\overline{BS31}$ to block lock circuit 59. When BIT2 of one of registers 60a–61f stores the block lock information for the respective block, the respective one of the $\overline{BS0}$–$\overline{BS31}$ signals is asserted. Each of the block lock signals $\overline{BS0}$ through $\overline{BS31}$ is used by block lock circuit 59 to assert the BL signal which locks control circuitry 57 from accessing the respective block of memory array 51 with respect to the programming and erasure operations. Which one of the $\overline{BS0}$ through $\overline{BS31}$ signals is applied to become the block lock BL signal depends on the selection of a multiplexer 92 of block lock circuit 59. Multiplexer 92 receives the addresses (i.e., block addresses) of an addressed block from bus 72 to selectively couple the respective one of the $\overline{BS0}$ through $\overline{BS31}$ signals of the addressed block to a NOR gate 93 of block lock circuit 59. When activated by the $\overline{WP}$ signal, NOR gate 93 of block lock circuit 59 asserts the block lock signal BL to control circuitry 57 to lock the addressed block from being programmed or erased when the respective one of the $\overline{BS0}$–$\overline{BS31}$ signals is asserted. The BL block lock signal is the complementary signal of the selected one of the $\overline{BS0}$ through $\overline{BS31}$ signals when the $\overline{WP}$ control signal applied to block lock circuit 59 is logically active low. The BL block lock signal is forced to be logically inactive low when the $\overline{WP}$ control signal is logically high. FIG. 5 illustrates, as an example, the relationship of the $\overline{WP}$, $\overline{BSI}$, and BL signals in a truth table.

Referring now to FIGS. 3 through 5, if the $\overline{WP}$ control signal is logically inactive high, block lock circuit 59 ignores all the block lock information stored in block status registers 60 and control circuit 57 is not locked from accessing memory array 51 and spare rows 55 for the programming and erasure operations. If the $\overline{WP}$ control signal is logically active low, block lock circuit 59 is enabled by the logical low $\overline{WP}$ signal to assert the BL signal in accordance with the block lock information stored in block status registers 60.

In order to update block status registers 60 with the block lock information stored in spare rows 55, a spare row read command is applied to control circuitry 57 to read the block lock information stored in spare rows 55 to status registers 60. This can be done even when the $\overline{WP}$ signal is asserted. Control circuitry 57 then accesses each of spare rows 55 to read the block lock information of each of the blocks of memory array 51. The block lock information of each of the blocks is then stored in the corresponding register of block status registers 60. For example, when SPARE ROW 0 for BLOCK0 does not store the block lock information and SPARE ROW 1 for BLOCK 1 stores the block lock information, control circuitry 57 updates block status registers 60 in accordance with this information.

The block locked information for a particular block is written into the associated spare row of spare rows 55 by control circuitry 57 during programming operation when that particular block is not locked from being programmed or erased. This can also be done even when the $\overline{WP}$ signal is asserted. For example, when BLOCK 0 of memory array 51 needs to be locked from being accessed for the programming and erasure operations and the block lock information is not stored in SPARE ROW 0, a "LOCK BLOCK 0" command is applied to control circuitry 57. Control circuitry 57 then writes the block lock information of BLOCK 0 into SPARE ROW 0.

To unlock a locked block of memory array 51, the $\overline{WP}$ control signal is made logically inactive high. This causes block lock circuit 59 to deassert the BL signal regardless of the block lock information for that locked block. This allows control circuitry 57 to access the locked block of memory array 51 for the programming and erasure operations. At this time, the block lock information for that particular locked block can be erased by the block erasure operation of that block. A locked block can undergo the programming and erasure operations only when the $\overline{WP}$ signal disables block lock circuit 59.

Referring back to FIG. 2, flash memory card 10 also includes a card control logic 13. For one embodiment, card control logic 13 includes a dedicated microcontroller.

Card control logic 13 interfaces between card pins of flash memory card 10 and memory array 11. Card control logic 13 is connected to buses 20 through 22 and line 35. Card control logic 13 also includes card data pins 25, card address pins 26, and card control pins 27. Card control logic 13 controls the memory operation of flash memory card 10. Card control logic 13 receives addresses, commands, data, and control signals from the host computer system via data pins 25, address pins 26, and control pins 27, respectively. Card control logic 13 in turn (1) oversees reading, erasing, and programming with respect to flash memory array 11, (2) oversees the power consumption of flash memory card 10, (3) oversees the sending out to the external host computer (not shown) card information structure data with respect to flash memory card 10, and (4) oversees the sending out to the host computer status information regarding flash memory card 10.

Card control logic 13 also includes a write protection register 14. Write protection register 14 is connected to $\overline{WP}$ pin of each of flash EPROMs 12a–12j and 13a–13j via line 35. Write protection register 14 stores write protect enable information to generate the write protect enable $\overline{WPE}$ signal. When the write protect enable information is stored in register 14, the $\overline{WPE}$ signal is asserted. When the $\overline{WPE}$ signal is asserted, the $\overline{WP}$ signal in each of flash EPROMs 12a–12j and 13a–13j is also asserted. This causes the block lock circuit in each of flash EPROMs 12a–12j and 13a–13j to lock the respective control circuitry from accessing the individual blocks in accordance with the block lock information stored in the respective spare rows and block status registers.

When the write protect enable information is not stored in register 14, the $\overline{WPE}$ signal is deasserted. This disables each of block write protect circuits 40a–40j and 41a–41j and each of flash EPROMs 12a–12j and 13a–13j can access all of its memory blocks for the programming and erasure operations regardless of the block lock information stored in the respective block write protect circuits. When this occurs, no individual block within a flash EPROM of memory array 11 is locked and the entire array of memory array 11 can be programmed or erased.

When the write protect enable information is stored in register 14, the $\overline{WPE}$ signal is asserted. This asserts the $\overline{WP}$ control signal of each of flash EPROMs 12a–12j and 13a–13j, which then enables the respective block write protect circuit. When this occurs, the block write protect circuit in each of flash EPROMs 12a–12j and 13a–13j then selectively locks individual memory blocks of the respective flash EPROM from being accessed for the programming and erasure operations in accordance with the block lock information stored in that block write protect circuit. For example, when the block lock information stored in block write protect circuit 40a indicates that blocks BLOCK 1 and BLOCK 15 (not shown in FIG. 2) of flash EPROM 12a are the locked blocks and the block lock information stored in block write protect circuit 40j indicates that blocks BLOCK 0 and BLOCK 1 (also not shown in FIG. 2) of flash EPROM 12j are the locked blocks, block write protect circuits 40a and 40j then disable access to those block, respectively, for the programming and erasure operations when the $\overline{\text{WPE}}$ signal is asserted. This allows other blocks of each of flash EPROMs 12a–12j and 13a–13j that are not locked to be still able to undergo the programming and erasure operations. This means that when the $\overline{\text{WPE}}$ signal is asserted, not the entire array of memory array 11 is locked. Only these blocks that are indicated by the block lock information to be locked are actually locked by their respective block write protect circuit in each of flash EPROMs 12a–12j and 13a–13j when the $\overline{\text{WPE}}$ signal is asserted. The $\overline{\text{WPE}}$ signal does not lock a specific block when asserted. The asserted $\overline{\text{WPE}}$ signal only enables the block write protect circuit in each of flash EPROMs 12a–12j and 13a–13j to lock those blocks that are to be write protected. Which blocks in each of flash EPROMs 12a–12j and 13a–13j are locked are determined by the block lock information stored in each of flash EPROMs 12a–12j and 13a–13j.

The block lock information stored in the block write protect circuit of each of flash EPROMs 12a–12j and 13a–13j can be changed or rewritten by the programming and erasure operations. The block lock information for a particular unlocked block can be written into the spare row associated with that block when the $\overline{\text{WPE}}$ signal is asserted. The block lock information for a particular locked block can only be erased from the associated spare row of that block when then $\overline{\text{WPE}}$ signal is deasserted. This further shows that the $\overline{\text{WPE}}$ signal is a block lock enable signal, not a block lock signal or a lock signal.

The write protect enable information can be written into register 14 by other circuitry (now shown in FIG. 2) of card control logic 13. When the external host computer (not shown) desires to enable the block write protect circuit in each of flash EPROMs 12a–12j and 13a–13j, the host computer sends a command to card control logic 13. Card control logic 13 then decodes the command and writes the write protect enable information into register 14. When the write protect enable information is written in register 14, the $\overline{\text{WPE}}$ signal is asserted. When the host computer does not want to enable the block write protect circuit in each of flash EPROMs 12a–12j and 13a–13j, the host computer then accesses card control logic 13 via another command. When receiving that command, card control logic 13 accesses register 14 to delete the write protect enable information. This in turn deasserts the $\overline{\text{WPE}}$ signal.

As can be seen from the above, specific regions (i.e., blocks) within memory array 11 of flash memory card 10 can be write protected when the $\overline{\text{WPE}}$ signal is asserted. In addition, other blocks of memory array 11 can still be accessed for the programming and erasure operations while those write protected blocks are locked. This helps avoid data corruption and facilitates storage of operating software that does not require frequent update. Moreover, the lock and unlock status of each block within memory array 11 can be changed such that a particular block can be unlocked to undergo the programming or erasure operation which other locked blocks remain locked by the active $\overline{\text{WPE}}$ signal.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A memory card, comprising:
 (A) a plurality of nonvolatile memories, each comprising
  (a) a first and a second individually erasable and programmable memory block;
  (b) a first and a second nonvolatile memory cell, each storing one of a first and a second datum indicating whether the respective one of the first and second blocks is locked;
  (c) a first and a second volatile register, each receiving and storing the respective one of the first and second datum when a read operation is performed on the respective one of the first and second memory cells;
  (d) a block lock circuit that, when enabled, provides a block lock signal in accordance with the first datum in the first register in response to the first block being addressed or the second datum in the second register in response to the second block being addressed to prevent the addressed one of the first and second blocks from being programmed and erased;
  (e) a control input that applies a control signal to enable the block lock circuit;
 (B) a register circuit that stores a control datum to generate the control signal to the control input of each of the plurality of nonvolatile memories, wherein when the register circuit does not store the control datum, the block lock circuit of each of the memories is disabled from providing the block lock signal;
 (C) a card control logic for interfacing the memories with external circuitry, wherein the register circuit is located in the card control logic and is allowed to be updated by the external circuitry with respect to the control datum, and
wherein the first memory cell is locked when the first block is locked and the second memory cell is locked when the second block is locked, wherein when the block lock circuit does not receive the control signal, each of the first and second datum stored in each of the first and second memory cells is allowed to be changed.

2. The memory card of claim 1, wherein the block lock circuit further comprises a NOR gate.

3. The memory card of claim 1, wherein the first and second registers receive the first and second datum upon an initiation of power to the memory card.

4. A computer system, comprising:
 (A) a central processing unit (CPU);
 (B) a memory card coupled to the CPU, wherein the memory card further comprises
  (I) a plurality of nonvolatile memories, each comprising
   (a) a first and a second individually erasable and programmable memory block;
   (b) a first and a second nonvolatile memory cell, each storing one of a first and a second datum indicating whether the respective one of the first and second blocks is locked;
   (c) a first and a second volatile register, each receiving and storing the respective one of the first and second datum when a read operation is performed on the respective one of the first and second memory cells;
   (d) a block lock circuit that, when enabled, provides a block lock signal in accordance with the first datum in the first register in response to the first block being addressed or the second datum in the second register in response to the second block being addressed to prevent the addressed one of the first and second blocks from being programmed and erased;

(e) a control input that applies a control signal to enable the block lock circuit;

(II) a register circuit that stores a control datum to generate the control signal to the control input of each of the memories, wherein when the register circuit does not store the control datum, the block lock circuit of each of the memories is disabled from providing the block lock signal;

(C) a card control logic for interfacing the plurality of nonvolatile memories with external circuitry, wherein the register circuit is located in the card control logic and is allowed to be updated by the external circuitry with respect to the control datum, and wherein the first memory cell is locked when the first block is locked and the second memory cell is locked when the second block is locked, wherein when the block lock circuit does not receive the control signal, each of the first and second datum stored in each of the first and second memory cells is allowed to be changed.

5. The computer system of claim 4, wherein the block lock circuit further comprises a NOR gate.

6. The computer system of claim 4, wherein the first and second registers receive the first and second datum upon an initiation of power to the memory card.

7. A method for use with a plurality of nonvolatile memories each having a first and a second individually erasable and programmable memory block, the method comprising the steps of:

(a) storing a first and a second datum in a first and a second nonvolatile memory cell, respectively, the first and second datum indicating whether the respective one of the first and second blocks is locked;

(b) receiving and storing in a first and a second volatile register the respective one of the first and second datum when a read operation is performed on the respective one of the first and second memory cells;

(c) providing, when a block lock circuit is enabled, a block lock signal in accordance with the first datum in response to the first block being addressed or the second datum in response to the second block being addressed to prevent the addressed one of the first and second blocks from being programmed and erased;

(d) applying a control signal to enable the block lock circuit; and (e) storing a control datum to generate the control signal to a control input of each of the plurality of nonvolatile memories, wherein when a register circuit does not store the control datum, the block lock circuit of each of the memories is disabled from providing the block lock signal, wherein the first memory cell is locked when the first block is locked and the second memory cell is locked when the second block is locked, wherein when the block lock circuit does not receive the control signal, each of the first and second datum stored in each of the first and second memory cells is allowed to be changed.

* * * * *